(12) United States Patent
Luo et al.

(10) Patent No.: US 9,905,277 B2
(45) Date of Patent: Feb. 27, 2018

(54) MEMORY CONTROLLING METHOD AND MEMORY SYSTEM

(71) Applicant: INDUSTRIAL TECHNOLOGY RESEARCH INSTITUTE, Hsinchu (TW)

(72) Inventors: Pei-Wen Luo, Kaohsiung (TW); Hsiu-Chuan Shih, Tainan (TW); Chi-Kang Chen, Zhudong Township, Hsinchu County (TW); Ding-Ming Kwai, Zhubei (TW); Cheng-Wen Wu, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 148 days.

(21) Appl. No.: 14/919,724

(22) Filed: Oct. 21, 2015

(65) Prior Publication Data
US 2017/0003908 A1 Jan. 5, 2017

(30) Foreign Application Priority Data

Jun. 30, 2015 (TW) .............................. 104121085 A
Aug. 28, 2015 (CN) .......................... 2015 1 0540007

(51) Int. Cl.
*G06F 3/06* (2006.01)
*G11C 7/10* (2006.01)
(Continued)

(52) U.S. Cl.
CPC ............ *G11C 7/10* (2013.01); *G06F 13/1642* (2013.01); *G06F 13/1647* (2013.01); *G11C 11/4076* (2013.01)

(58) Field of Classification Search
CPC .... G06F 1/3296; G06F 1/3275; G06F 3/0673; G06F 3/0604; G06F 3/0634;
(Continued)

(56) References Cited

U.S. PATENT DOCUMENTS 5,822,772 A * 10/1998 Chan ........................ G11C 7/22
710/52
5,826,092 A 10/1998 Flannery
(Continued)

FOREIGN PATENT DOCUMENTS

CN 100416460 C 9/2008
CN 103678247 A 3/2014
(Continued)

OTHER PUBLICATIONS

Elliott Cooper-Balis et al., "Fine-Grained Activation for Power Reduction in DRAM", 2010.
(Continued)

*Primary Examiner* — Hashem Farrokh
(74) *Attorney, Agent, or Firm* — Rabin & Berdo, P.C.

(57) ABSTRACT

A memory system comprises a memory controller and a memory device having one or more memory ranks and multiple memory electrically connected to the one or more memory ranks. The memory controller includes at least one analysis module and at least one switching determination module. The analysis module analyzes states of multiple memory control commands corresponding to a particular memory rank to generate a control parameter. The switching determination module determines whether at least one switching command is sent according to the control parameter, a current operation mode of the particular memory rank, and an operation state of the particular memory rank. When the memory device receives a first switching command of the at least one command, the particular rank and
(Continued)

at least one part of the memory internal circuits are switched from the normal voltage operation mode to the low voltage operation mode.

18 Claims, 8 Drawing Sheets

(51) Int. Cl.
 *G11C 11/4076* (2006.01)
 *G06F 13/16* (2006.01)
(58) Field of Classification Search
 CPC ............... G06F 3/0653; G06F 13/1642; G06F 13/1647; G11C 11/4074; G11C 11/4076; G11C 7/1045; G11C 7/10
 See application file for complete search history.

(56) References Cited

U.S. PATENT DOCUMENTS

| 6,115,319 | A | 9/2000 | Kinoshita et al. |
| 6,288,963 | B1 | 9/2001 | Kato |
| 6,366,989 | B1 * | 4/2002 | Keskar ................ G06F 13/1694 365/189.15 |
| 7,028,200 | B2 | 4/2006 | Ma |
| 8,499,206 | B2 | 7/2013 | Cho et al. |
| 8,605,535 | B2 | 12/2013 | Chen et al. |
| 2001/0001598 | A1 | 5/2001 | Narui et al. |
| 2004/0057324 | A1 | 3/2004 | Abe et al. |
| 2005/0213414 | A1 | 9/2005 | Horiguchi et al. |
| 2009/0019243 | A1 * | 1/2009 | Hur ........................ G06F 1/3225 711/158 |
| 2010/0157697 | A1 * | 6/2010 | Sato ........................ G11C 5/147 365/189.11 |
| 2013/0124805 | A1 * | 5/2013 | Rafacz ................ G06F 13/1642 711/151 |
| 2014/0032941 | A1 | 1/2014 | Kajigaya et al. |
| 2014/0208144 | A1 | 7/2014 | Ma |
| 2015/0036446 | A1 | 2/2015 | Kenkare et al. |
| 2015/0089164 | A1 * | 3/2015 | Ware ........................ G11C 5/02 711/149 |

FOREIGN PATENT DOCUMENTS

| TW | 200907990 A | 2/2009 |
| TW | 201225079 A | 6/2012 |

OTHER PUBLICATIONS

Howard David et al., "Memory Power Management via Dynamic Voltage/Frequency Scaling", 2011.
Ibrahim Hur et al., "A Comprehensive Approach to DRAM Power Management", 2008.
Karthik Elangovan et al., "Adaptive Memory Power Management Techniques for HPC Workloads", 2011.
Karthik Chandrasekar et al., "Run-Time Power-Down Strategies for Real-Time SDRAM Memory Controllers", 2012.
Hongzhong Zheng et al., "Mini-Rank: Adaptive DRAM Architecture for Improving Memory Power Efficiency", 2008.

* cited by examiner

|  | tCK(ns) | tRL(clk) | tRTP (cycle) | tRAS (cycle) | tRCD (cycle) | tRP (cycle) | tRC (cycle) |
|---|---|---|---|---|---|---|---|
| Normal operation voltage (1.2V) | 5 | 1 | 2 | 1 | 1 | 1 | 2 |
| DVFS (1.0V) | 6.5 | 1 | 2 | 1 | 1 | 1 | 2 |
| This embodiment (1.0V) | 5 | 2 | 3 | 1 | 1 | 1 | 2 |
|  | IDD0 (mA) | IDD1 (mA) | IDD4W (mA) | IDD4R (mA) | IDD5 (mA) | | |
| Normal operation voltage (1.2V) | 20.5 | 29.192 | 27.204 | 40.836 | 32.8 | | |
| DVFS (1.0V) | 14.9 | 16.756 | 14.695 | 21.784 | 23.84 | | |
| This embodiment (1.0V) | 19.37 | 19.031 | 19.104 | 28.436 | 30.992 | | |

FIG. 8

|  | Max bandwidth (GB/s) | Power consumption for activation(pJ) | Power consumption for reading(pJ) | Power consumption for writing(pJ) |
|---|---|---|---|---|
| Normal operation voltage (1.2V) | 51 | 205 | 204.18 | 136.02 |
| DVFS (1.0V) | 39 | 193.7 | 142.18 | 95.52 |
| This embodiment (1.0V) | 51 | 193.7 | 142.18 | 95.52 |

FIG. 9

MEMORY CONTROLLING METHOD AND MEMORY SYSTEM

CROSS REFERENCE TO RELATED APPLICATION

This application claims the priority benefit of Taiwan application serial no. 104121085, filed on Jun. 30, 2015 and claims the priority benefit of People's Republic of China application serial no. 201510540007.7, filed on Aug. 28, 2015. The disclosure of this application is hereby incorporated by reference herein in its entirety.

TECHNICAL FIELD

The technical field relates to a memory controlling method and a memory system.

BACKGROUND

Electronic devices with high performance and low power consumption are gradually becoming a market trend for recent years. A dynamic random access memory (DRAM) consumes most of the power in an electronic device. Currently, for the development of the DRAM, in addition to increasing the storage capacity of the DRAM, speeding up the operation of the DRAM and achieving broad band for data transmission, and decreasing the power consumption of the DRAM are major research directions in the industry. In general, the DRAM with low power consumption could be realized by the methods such as adopting advanced process to achieve a low voltage operation, lowering the value of the input/output capacitance of the DRAM, providing deep power down mode and altering the data update frequency of the storage units of the cell array in the DRAM. However, these methods may increase the manufacturing cost and may not substantially decrease the power consumption of the chip.

SUMMARY OF THE DISCLOSURE

The exemplary embodiments of the disclosure may provide a memory system and a method for controlling a memory in the memory system thereof.

One exemplary embodiment of the disclosure relates to a memory system. The memory system may comprises a memory controller, and a memory device having one or more memory ranks and a plurality of memory internal circuits electrically connected to the one or more memory ranks. The memory controller at least includes at least one analysis module and at least one switching determination module. The at least one analysis module analyzes one or more states of a plurality of memory control commands corresponding to a particular memory rank of the one or more memory ranks and generates a control parameter. The at least one switching determination module determines whether at least one switching command is sent according to the control parameter, a current operation mode of the particular memory rank and an operation state of the particular memory rank. When the memory device receives a first switching command of the at least one switching command, the particular rank and at least one part of the plurality of memory internal circuits are switched from a normal voltage operation mode to a low voltage operation mode.

Another exemplary embodiment of the disclosure relates to a method for controlling a memory in a memory system having a plurality of memory internal circuits and one or more memory ranks electrically connected to the plurality of memory internal circuits. The method may comprise: analyzing one or more states of multiple memory control commands corresponding to a particular memory rank of the one or more memory ranks and generating a control parameter; determining whether at least one switching command is sent or not according to the control parameter, a current operation mode of the particular memory rank and an operation state of the particular memory rank; and switching the particular rank and at least one part of the plurality of memory internal circuits from a normal voltage operation mode to a low voltage operation mode, when the memory system receiving a first switching command of the at least one switching command.

BRIEF DESCRIPTION OF THE DRAWINGS

FIG. 8 shows respective parameter setting for a memory controlling method operating at a normal operation voltage, a dynamic voltage frequency switching (DVFS) method operating at a low voltage, and some circuits in an exemplary embodiment of the present disclosure operating at the low voltage.

FIG. 9 shows the comparisons of bandwidths and power consumptions for the memory controlling method, the DVFS method and the controlling method of an exemplary embodiment of the disclosure.

DETAILED DESCRIPTION OF DISCLOSED EXEMPLARY EMBODIMENTS

Figure 1:
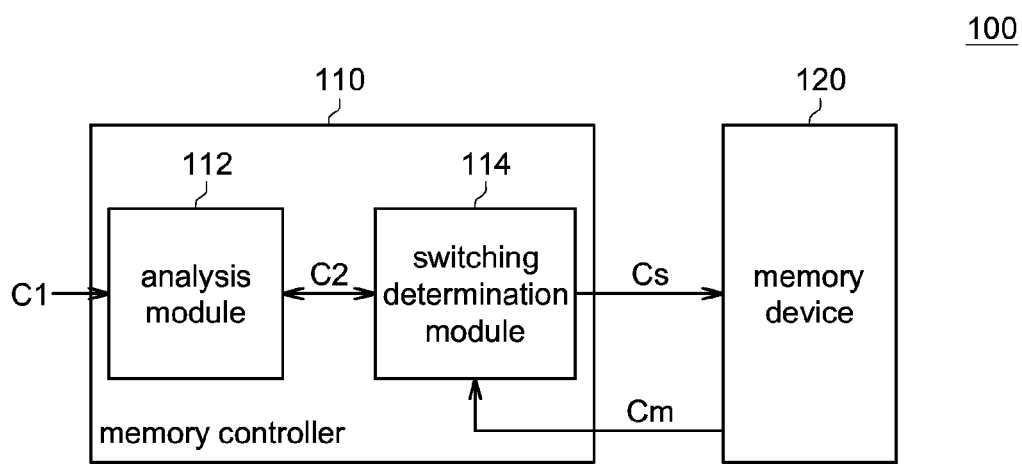
FIG. 1 shows a block diagram of a memory system in accordance with an exemplary embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a block diagram of a memory system in accordance with an exemplary embodiment of this disclosure. Referring to FIG. 1, a memory system 100 comprises a memory controller 110 and a memory device 120. The memory device 120 has one or more memory ranks and a plurality of memory internal circuits electrically connected to the one or more memory ranks. In one example, the one or more memory ranks may be included in a cell array, and these memory internal circuits are electrically connected to the cell array. The memory controller 110 at least includes at least one analysis module 112 and at least one switching determination module 114. The at least one analysis module 112 analyzes one or more states of multiple memory control commends C1, and generates a control parameters C2. The at least one switching determination module 114 determines whether at least one switching command Cs is sent according to the control parameter C2, a current operation mode Cm of a particular memory rank of the one or more memory ranks, and an operation state of the particular memory rank. When the memory device receives a first switching command of the at least one switching command Cs, the particular rank and at least one part of the plurality of memory internal circuits are switched from a normal voltage operation mode to a low voltage operation mode.

According to this exemplary embodiment, the memory system 100 decides to switch the memory device 120 from the normal voltage operation mode to the low voltage operation mode according to the one or more states of the memory control commends analyzed by the memory controller 110. By switching the voltage operation mode of the memory device 120, the power consumption of the memory device 120 may be reduced.

Figure 2:
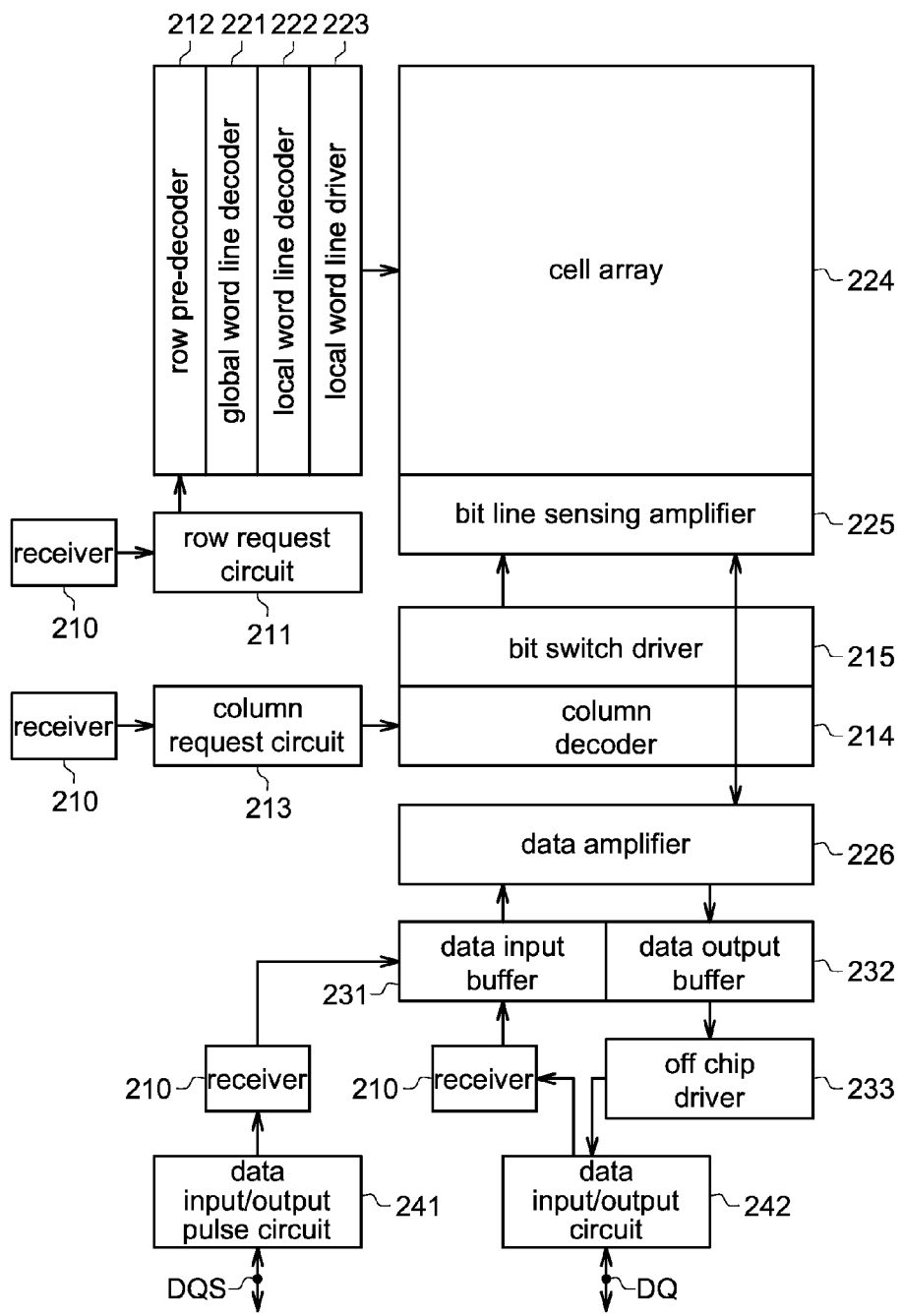
FIG. 2 shows a circuit structure of the memory device shown in FIG. 1, in accordance with an exemplary embodiment of the disclosure.

FIG. 2 shows an exemplary circuit structure of the memory device 120 shown in FIG. 1 according to this disclosure. Referring to FIG. 2, the memory device 120 may comprise a receiver 210, a row request circuit 211, a row pre-decoder 212, a column request circuit 213, a column decoder 214, a bit switch (BS) driver 215, a global word line decoder 221, a local word line decoder 222, a local word line driver 223, a cell array 224 having the one or more memory ranks, a bit line sensing amplifier 225, a data amplifier 226, a data input buffer 231, a data output buffer 232, an off chip driver 233, a data input/output pulse circuit 241 and a data input/output circuit 242.

According to the exemplar of FIG. 2, the receiver 210 may receive the multiple memory control commends C1 from the memory controller 110, wherein the row request circuit 211 may deal with row related commends such as activation (ACT) commands and pre-charge (PRE) commands, while the column request circuit 213 may deal with column related commands such as reading (RD) commands and writing (WR) commands. The row pre-decoder 212, the global word line decoder 221 and the local word line decoder 222 may be combined into a row decoder that decodes commands to select a word line to be operated. Similarly, the column decoder 214 may decode commands to select a word line to execute commands. The global word line decoder 221 and the local word line decoder 222 may be, but not limited to column logic devices. The data amplifier 226 may be, but not limited to a row logic device.

For example, the row decoder may turn on one of the word lines according to an ACT command. According to a RD command, the column decoder 214 may turn on one of the word lines to access data in the cell array. The data is then read out through the bit line sensing amplifier 225 and the data amplifier 226. The data is subsequently transmitted through the local word line driver 223 and the data input/output circuit 242, and is finally output through a data strobe signal (DQS) terminal and a DQ terminal.

In this disclosure, the aforementioned circuits may be a timing dependence circuit or a timing independence circuit, wherein the timing dependence circuit is relevant to a clock cycle related circuit while the timing independence circuit is irrelevant to the clock cycle related circuit. In this disclosure, operations of these timing independence circuits are switchable between a low voltage operation mode and a normal voltage operation mode while the operations of these timing dependence circuits are kept in the normal voltage operation mode. Without changing the operation frequency, the power consumption of the memory system is economized while the clock frequency of the bus is kept.

According to an exemplary embodiment of this disclosure, the timing dependence circuits may comprise the receiver 210, the cell array 224, the bit line sensing amplifier 225, the off chip driver 233, the data input/output pulse circuit 241 and the data input/output circuit 242. The timing independence circuits may comprise the row request circuit 211, the row pre-decoder 212, the column request circuit 213, the column decoder 214, the bit switch (BS) driver 215, the global word line decoder 221, the local word line decoder 222, the local word line driver 223, the data amplifier 226, the data input buffer 231 and the data output buffer 232.

FIG. 8 shows respective parameter setting for a memory controlling method operating at a normal operation voltage (for example, 1.2V), a dynamic voltage frequency switching (DVFS) method operating at a low voltage (for example, 1.0V), and some circuits in an exemplary embodiment of the disclosure operating at the low voltage (1.0V).

In the FIG. 8, the parameter tCK is a clock cycle in the unit of nanosecond (ns). The parameter tRL is a waiting time for reading. The parameter tRTP is a waiting time from a reading command to a pre-charge command. The parameter tRAS is a waiting time from a row command to a pre-charge command. The parameter tRCD is a waiting time from a row command to a column command. The parameter tRP is a waiting time from a pre-charge command to an activation command. The parameter tRC is a row cycle which is equivalent to the sum of tRAS and tRP. The IDD0 is the electric current while activation commends and pre-charge commands are continuously executed for the receiver 210, the row request circuit 211, the row pre-decoder 212, the global word line decoder 221, the local word line decoder 222, the local word line driver 223, the cell array 224 and the bit line sensing amplifier 225. The IDD1 is the electric current while activation commends, reading commends and pre-charge commands are continuously executed for the aforementioned components. The IDD4W is the electric current while writing commends are continuously executed for the aforementioned components. The IDD4R is the electric current while reading commends are continuously executed for the aforementioned components. The IDD5 is the electric current in unit of milliamps (mA) while reference (REF) commends are continuously executed for the aforementioned components.

As may be seen from FIG. 8, the DVFS method and the controlling method of this embodiment of the present disclosure may be used to reduce the current. The number of clock cycles for the parameter tRL, tRTP, tRAS, tRCD, tRP or tRC used in the DVFS method is the same as that used at the normal operation voltage. However, the clock cycle of the DVFS method is changed (from 5 ns to 6.5 ns). Therefore, the corresponding periods of the parameters tRL, tRTP, tRAS, tRCD, tRP and tRC of the DVFS method are accordingly changed. In this condition, the operation frequencies of the memory device 120 and the memory controller 110 are accordingly changed. Since an access request from a processor is received by the memory controller 110, the operation frequencies of the memory controller 110 and the memory device 120 are different from the operation frequency of the processor. If the operation frequency of the processor is not changed, it is difficult to control the memory device operating at different operation frequencies. On the contrary, the length of the clock cycle is kept, that is, the operation frequency is not changed, in this disclosed exemplary embodiment of the present disclosure, while the delay time between commands is changed. For example, the parameters tRL, tRTP, tRAS, tRCD, tRP and tRC in this disclosed exemplary embodiment of the present disclosure may be changed. In the present disclosure, the power consumption of the memory device may be reduced by changing the parameters tRL and tRTP. Without changing the operation frequency of the memory device in the present disclosure, the power consumption of the memory system in the present disclosure is economized while a wider bandwidth is kept.

FIG. 9 shows the comparisons of bandwidths and power consumptions for the memory controlling method, the DVFS method and the controlling method of the exemplary embodiment of the present disclosure. As may be seen from FIG. 9, the DVFS method and the controlling method in the exemplary embodiment of the present disclosure may be used to reduce the power consumption for activation, the power consumption for reading and the power consumption for writing. Comparing with the DVFS method, the controlling method in the exemplary embodiment of the present disclosure may keep the maximum bandwidth for the data transmission without reducing the transmission speed of the memory bus.

Figure 3:
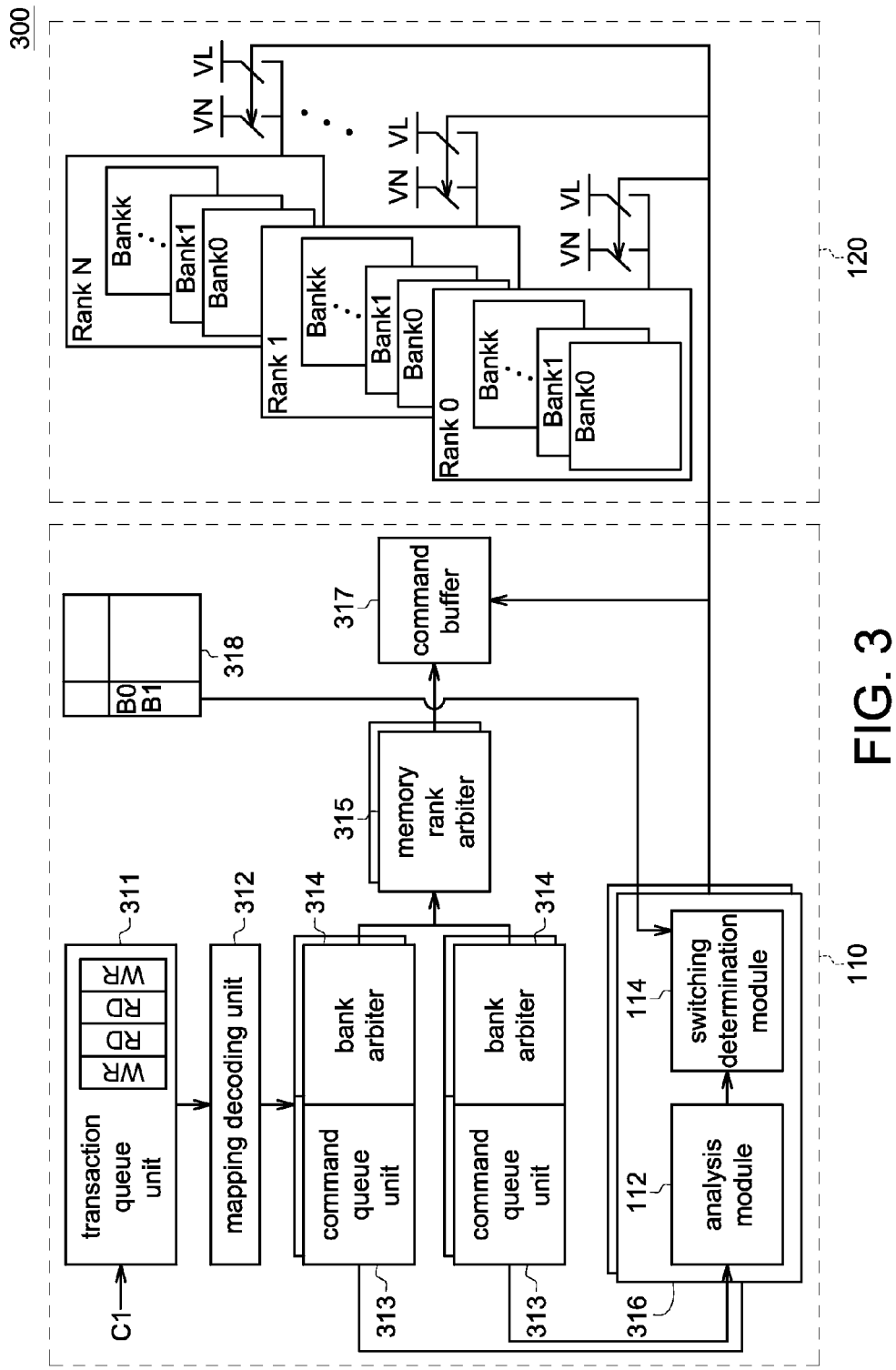
FIG. 3 shows a structure of memory system in accordance with an exemplary embodiment of the disclosure.

FIG. 3 shows a memory system according to FIG. 1. Referring to FIG. 3, the memory controller 110 may further include a transaction queue unit 311, a mapping decoding unit 312, a plurality of command queue units 313, a plurality of bank arbiters 314, a plurality of memory rank arbiters 315, an analysis unit 316, a command buffer 317 and a state table 318. The transaction queue unit 311 of the memory controller 110 receives and temporarily stores a dada access request C1 such as a reading (RD) command and/or a writing (WR) command from the processor. The memory controlling command (data access request C1) decoded by the mapping decoding unit 312 is then transmitted to the command queue unit 313. According to this exemplary embodiment, each memory bank may have one command queue unit 313 and one bank arbiter 314. The command queue unit 313 temporarily stores these decoded memory controlling commands. The bank arbiter 314 selects one of the commands in the command queue unit 313 and transmits this command to the memory rank arbiter 315. Similarly, each memory rank may have a corresponding memory rank arbiter 315 according to this exemplary embodiment. Each memory rank corresponds to one state table 318. Each state table 318 records the state of each memory bank in its corresponding memory rank.

According to this exemplary embodiment, a memory rank is used as a unit. The memory device 120 may comprise one or more memory ranks labeled as Rank 0~Rank N. Each memory rank may comprise one or more memory banks labeled as Bank 0~Bank N. The analysis unit 316 in the memory controller 310 further includes the at least one analysis module 112 and the at least one switching determination module 114. Each memory rank corresponds to one analysis module of the at least one analysis module 112. The analysis module analyzes states of multiple memory control commands corresponding to multiple command queue units 313 in a particular memory rank to generate a control parameter. The control parameter may be a low voltage parameter or a normal voltage parameter, representing a memory device operating in a low voltage operation mode or in a normal voltage operation mode, respectively. The switching determination module determines whether a switching command is sent according to the control parameter and the current operation mode of the memory device 120. The switching command may be a first switching command or a second switching command. When the memory device receives the first switching command, the particular rank and at least one part of the memory internal circuits are switched from the normal voltage operation mode to the low voltage operation mode. On the contrary, when the memory device receives the second switching command, the particular rank and at least one part of the memory internal circuits are switched from the low voltage operation mode to the normal voltage operation mode.

For example, when the control parameter is a low voltage parameter and the current operation mode of the memory device 120 is a low voltage operation mode, no switching command is sent. When the control parameter is a low voltage parameter and the current operation mode of the memory device 120 is a normal voltage operation mode, a first switching command is sent by the switching determination module to switch the memory device 120 to a low voltage operation mode VL. When the control parameter is a normal voltage parameter and the current operation mode of the memory device 120 is a low voltage operation mode, a second switching command is sent by the switching determination module to switch the memory device 120 to a normal voltage operation mode VN. When the control parameter is a normal voltage parameter and the current operation mode of the memory device 120 is a normal voltage operation mode, no switching command is sent.

According to one exemplary embodiment, the analysis module analyzes one or more states of multiple memory control commands stored in multiple command queues. For example, the degree of distribution of multiple command queue units 313 in different memory banks of a memory rank is analyzed to generate a rank interleave parameter $\beta$. A smaller $\beta$ represents that the multiple memory control commands are more uniformly distributed in these multiple command queue units 313. A larger $\beta$ represents that the multiple memory control commands are less uniformly distributed in multiple command queue units 313. For example, the multiple memory control commands are more concentrated in a command queue unit 313 of a certain memory bank. The analysis module generates a control parameter according to the rank interleave parameter $\beta$ of the memory rank. For example, a threshold value $\beta th$ may be set. When a rank interleave parameter $\beta$ is less than the threshold value $\beta th$, a low voltage parameter is generated. When the rank interleave parameter $\beta$ is greater than the threshold value $\beta th$, a normal voltage parameter is generated.

Figure 4:
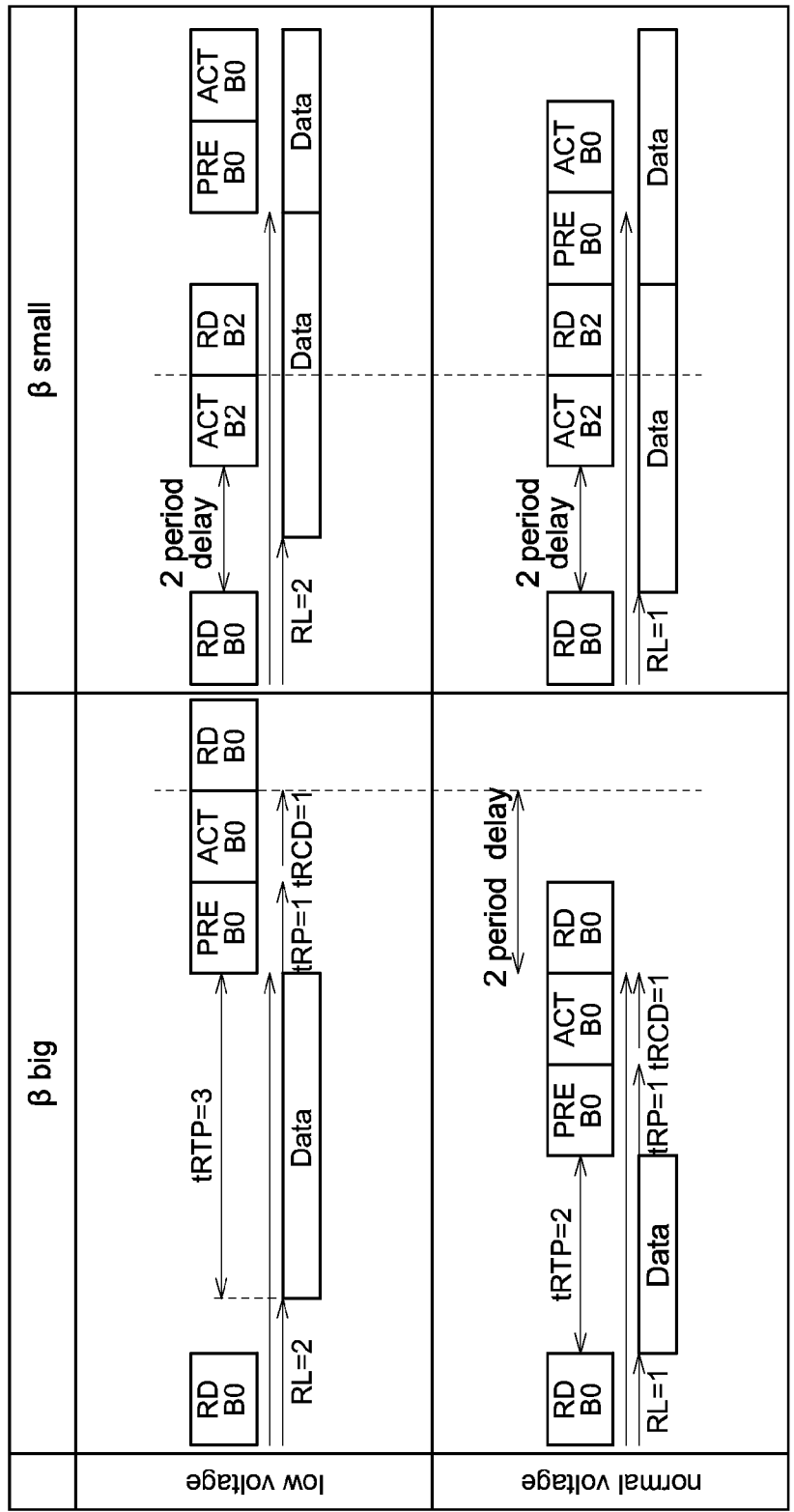
FIG. 4 shows a timing diagrams of operating in a low voltage operation mode and a normal voltage operation mode for different rank interleave parameters $\beta$, respectively, in accordance with an exemplary embodiment of the disclosure.

In FIG. 4, the pros and cons of operating in a low voltage operation mode and a normal voltage operation mode under the conditions of different rank interleave parameters $\beta$ are compared. FIG. 4 shows timing diagrams of operating in the low voltage operation mode and the normal voltage operation mode for different rank interleave parameters $\beta$. Referring to FIG. 4, the timing diagram in an upper left corner shows that when $\beta$ is larger (i.e. the degree of distribution is lower), the memory device is operated in the low voltage operation mode. Assume that the multiple memory control commands all concentrate in the Bank 0 (B0) in the low voltage operation mode. According to FIG. 9, tRL (waiting time for reading) is 2 clock cycles. tRTP (waiting time from a reading (RD) command to a pre-charge (PRE) command) is 3 clock cycles. tRP (waiting time from a pre-charge command to an activation command) is 1 clock cycle. tRCD (waiting time from a row command to a column command) is 1 clock cycle. In other words, 7 clock cycles are needed from a first reading command to a next reading command.

In FIG. 4, the timing diagram in a lower left corner shows that when β is larger (i.e. the degree of distribution is lower), the memory device is operated in the normal voltage operation mode. According to FIG. 9, tRL is 1 clock cycle. tRTP is 2 clock cycles. tRP is 1 clock cycle. tRCD is 1 clock cycle. In other words, 5 clock cycles are needed from a first reading command to a next reading command.

Therefore, when β is larger, the memory device is operated in the low voltage operation mode. A delay of 2 clock cycles will be generated for executing a reading command. If the reading commands are all executed in the same memory bank afterwards, a huge delay accumulated will be generated, wherein the huge delay is a product of 2 clock cycles and the number of the multiple memory control commands.

On the other hand, the timing diagram in an upper right corner of FIG. 4, shows that when β is smaller (i.e. the multiple memory control commands are distributed more uniformly), the memory device is operated in the low voltage operation mode. Under the condition, tRL is also 2 clock cycles. Since the multiple memory control commands are distributed in different memory banks, therefore, the memory control commands ACT and RD in Bank 2 (B2) may be simultaneously executed during a waiting time. Assume that an activation command in the Bank 2 (B2) is executed after an interval of 2 clock cycles from the reading command in the BANK 0 (B0) and tRCD is 1 clock cycle, then, 4 clock cycles are needed from a first reading command to a next reading command in the BANK 0.

The timing diagram in a lower right corner of FIG. 4 shows that when iβ is smaller (i.e. the multiple memory control commands are more uniformly distributed), the memory device is operated in the normal voltage operation mode. Under the condition, tRL is 1 clock cycle. An activation command in the Bank 2 (B2) is executed after an interval of 2 clock cycles from the reading command in the BANK 0 (B0). tRCD is 1 clock cycle. In other words, 4 clock cycles are needed from a first reading command to a next reading command.

From the aforementioned description, it can be seen that when the memory device is operated with larger β in the low voltage operation mode, each execution for a reading command will generate a delay of 2 clock cycles. This will affect the performance of the memory device. Therefore, the memory device may be set to operate with larger β in the normal voltage operation mode. The aforementioned situation of generating a delay of 2 clock cycles for each execution of a reading command can be prevented. When β is smaller, the memory device operated in the low voltage operation mode would not generate a delay. Therefore, the memory device may be set to operate with a smaller β in the low voltage operation mode.

According to another exemplary embodiment, the analysis module analyzes a total quantity of the multiple memory control commands stored in multiple command queues. For example, the total quantity of memory control commands stored in multiple the command queue units 313 of different banks in a memory rank is analyzed to generate a number request parameter $N_{Qr}$. A larger $N_{Qr}$ represents that there are more memory control commands stored in the command queues of the memory rank. A smaller $N_{Qr}$ represents that there are less memory control commands are stored in command queues of the memory rank. The command queue units 313 generate a control parameter according to the number request parameter $N_{Qr}$. For example, a threshold value $N_{Qrth}$ may be set. When the number request parameter $N_{Qr}$ is greater than the threshold value $N_{Qrth}$, a normal voltage parameter is generated. When the number request parameter $N_{Qr}$ is less than the threshold value $N_{Qrth}$, a low voltage parameter is generated.

Figure 5:
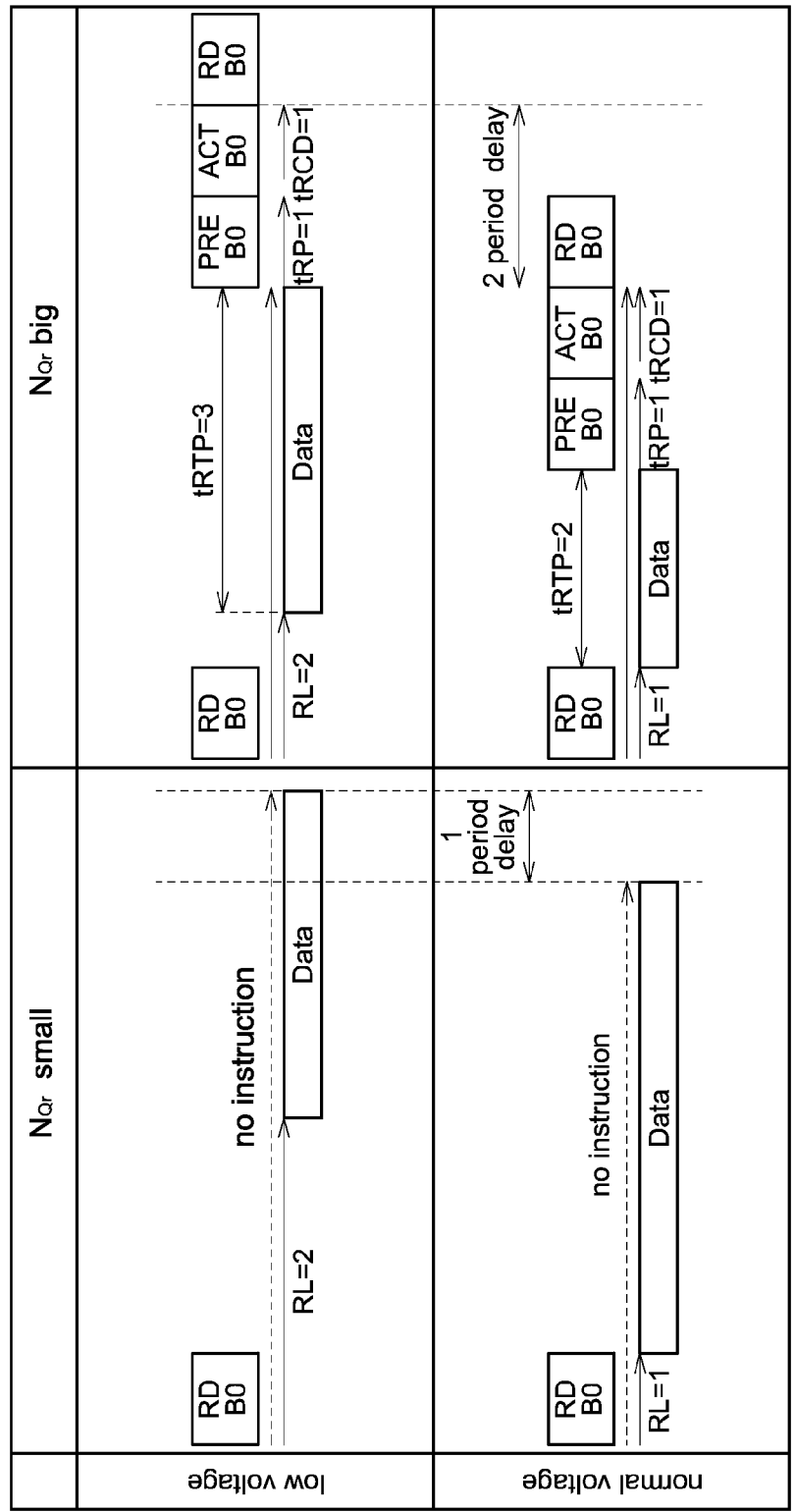
FIG. 5 shows a timing diagrams of operating in a low voltage operation mode and a normal voltage operation mode for different number request parameters $N_{Qr}$, respectively, in accordance with an exemplary embodiment of the disclosure.

In FIG. 5, the pros and cons of operating in the low voltage operation mode and the normal voltage operation mode under the conditions of different number request parameters $N_{Qr}$ are compared. FIG. 5 shows timing diagrams of operating in the low voltage operation mode and the normal voltage operation mode for different number request parameters $N_{Qr}$. Referring to FIG. 5, the timing diagram in an upper left corner shows the condition that when $N_{Qr}$ is smaller (i.e. the number of memory control commands is smaller), the memory device is operated in the low voltage operation mode. Assume that there is only one memory control command. At the time, tRL is 2 clock cycles. As also shown in the timing diagram in a lower left corner of FIG. 5, wherein $N_{Qr}$ is smaller, the memory device is operated in the normal voltage operation mode. At the time, tRL is 2 clock cycles.

Therefore, when the memory device is operated with a smaller $N_{Qr}$ comparing with the memory device operated in the normal voltage operation mode, a delay of 1 clock cycle will be generated for executing a reading command in the low voltage operation mode. Since the total quantity of memory control commands is smaller (in this case, there is no more command afterwards), the delay time is accordingly shorter.

As shown in an upper right corner of FIG. 5, when $N_{Qr}$ is larger (i.e. the number of memory control commands is larger), the memory unit is operated in the low voltage operation mode. At the time, tRL is also 2 clock cycles. Since the number of the multiple memory control commands is larger (i.e. there is at least one command to be executed afterwards), tRTP is 3 clock cycles. Therefore, 7 clock cycles are needed from a first reading command to a next reading command in the BANK 0.

As shown in lower right corner of FIG. 5, when $N_{Qr}$ is larger (i.e. the number of memory control commands is larger), the memory device is operated in the normal voltage operation mode. At the time, tRL is 1 clock cycle. tRTP is 2 clock cycles. tRCD is 1 clock cycle. In other words, 5 clock cycles are needed from a first reading command to a next reading command.

Therefore, when the memory device is operated with a larger $N_{Qr}$, comparing with the memory device operated in the normal voltage operation mode, a delay of 2 clock cycles will be generated for executing a reading command in the low voltage operation mode. Since the total quantity of the multiple memory control commands is larger, the delay time is accordingly longer.

As may be seen from the aforementioned description, when the memory unit is operated with smaller $N_{Qr}$ in the low voltage operation mode, each execution for a reading command will generate a delay of less clock cycles. A threshold value $N_{Qrth}$ may be set by the analysis module when the number request parameter $N_{Qr}$ is less than the threshold value $N_{Qrth}$, the low voltage operation mode is used. However, when $N_{Qr}$ is larger, the memory device operating in the low voltage operation mode will generate more delays. Therefore, the analysis module may set an $N_{Qr}$ greater than the threshold $N_{Qrth}$, so that the effect of the performance of the memory device can be prevented.

According to another exemplary embodiment, the analysis module simultaneously analyze a rank interleave parameter β and a number request parameter $N_{Qr}$ to determine the memory device is operated in the normal voltage operation mode or in the low voltage operation mode. For example, the analysis module further determines whether a product S of a rank interleave parameter β and a number request parameter $N_{Qr}$ is greater than a threshold value Sth. When the product S is greater than the threshold value Sth, a control parameter representing a normal voltage operating voltage is generated. When the product S is smaller than the threshold value Sth, a control parameter representing a low voltage operating voltage is generated.

Yet according to another exemplary embodiment, the switching determination module determines whether a switching command is sent according to a control parameter and an operation state of the particular memory rank in the memory device 120. For example, when the operation state of a memory rank is a burst mode, that is, when data D1 is sent back to the processor through the memory controller 110, the switching determination module decides not sending a switching command, or a switching command sent by the switching determination module is buffered by such as the command buffer 317 for not performing an operation of switching voltage. So that, the data transmission is not affected. In addition, when the operation state of a memory rank is a writing mode or a reading mode, the switching determination module decides not sending a switching command, or a switching command sent by the switching determination module is buffered by such as the command buffer 317 for not performing an operation of switching voltage. So that, reading or writing data is not affected.

Figure 6:
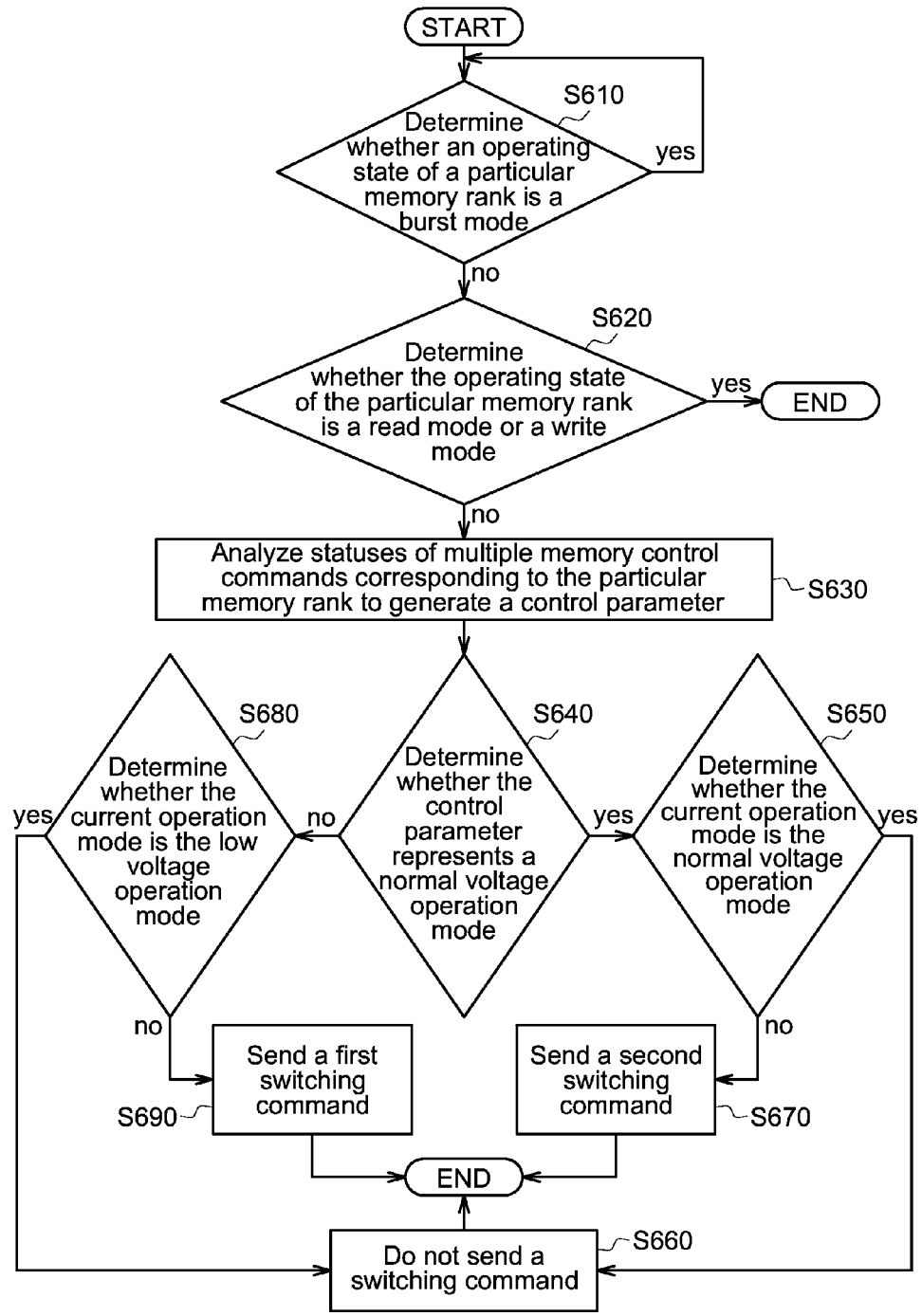
FIG. 6 shows a flow chart of a method for controlling a memory in a memory system, in accordance with an exemplary embodiment of the disclosure.

FIG. 6 shows a flow chart of a method for controlling a memory in the memory system 100 shown in FIG. 1, in accordance with an exemplary embodiment of the disclosure. Referring to FIG. 6, in step S610, whether an operation state of a particular memory rank is a burst mode is determined. In step S610, when the operation state of the particular memory rank is the burst mode, a switching command is not sent. When the operation state of the particular memory rank is not the burst mode, step S620 is performed to determine whether the operation state of the particular memory rank is a reading mode or a writing mode. When the operation state of the particular memory rank is the reading mode or the writing mode, no switching command is sent. When the operation state of the particular memory rank is neither the reading mode nor the writing mode (S620, no), step S630 is performed to analyze one or more states of multiple memory control commands corresponding to the particular memory rank to generate a control parameter. Step S640 is then performed to determine whether the control parameter represents a normal voltage operation mode. When the control parameter represents the normal voltage operation mode (S640, yes), step 650 is performed to determine whether the current operation mode is the normal voltage operation mode. When the current operation mode is the normal voltage operation mode (S650, yes), step S660 is performed, that is, do not send a switching command. When the current operation mode is not the normal voltage operation mode (S650, no), step S670 is performed to send a second switching command.

When the control parameter doesn't represent the normal voltage operation mode (S640, no), step 680 is performed to determine whether the current operation mode is the low voltage operation mode. When the current operation mode is the low voltage operation mode (S680, yes), step S660 is performed, that is, do not send a switching command. When the current operation mode is not the low voltage operation mode (S680, no), step S690 is performed to send a first switching command.

This disclosure is not limited to the aforementioned steps shown in the flow chart. A person having ordinary skill in the art may adjust the sequence or perform the aforementioned steps repeatedly according to a practical application.

For example, according to one exemplary embodiment, the method for controlling a memory used in the memory system 100 having a plurality of memory internal circuits and one or more memory ranks electrically connected to the plurality of memory internal circuits may comprise: analyzing one or more states of multiple memory control commands corresponding to a particular memory rank of one or more memory ranks, and generating a control parameter; determining whether at least one switching command is sent or not according to the control parameter, a current operation mode of the particular memory rank and an operation state of the particular memory rank; and switching the particular rank and at least one part of the plurality of memory internal circuits from a normal voltage operation mode to a low voltage operation mode, when the memory system receiving a first switching command of the at least one switching command.

Figure 7:
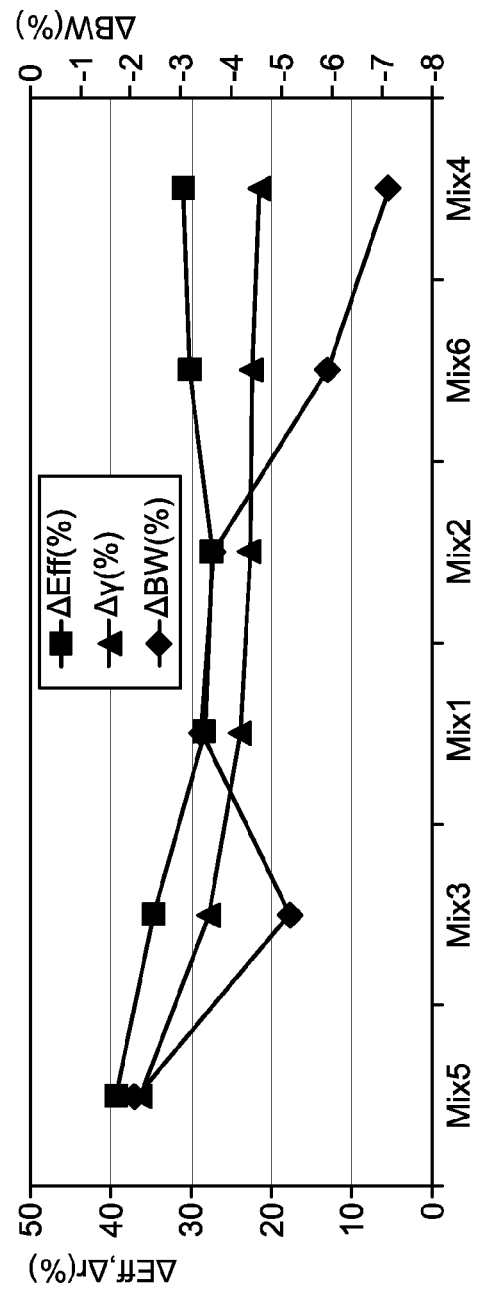
FIG. 7 shows schematic views illustrating a simulation result of a method for controlling a memory in a memory system, in accordance with an exemplary embodiment of the disclosure.

FIG. 7 shows a simulation result of a method for controlling a memory in a memory system, in accordance with an exemplary embodiment of the disclosure. In FIG. 7, a processor, a memory device and a memory controller are used to simulate 6 different combinations (Mix1~Mix6). In the simulation, a 5% of IDD4W (voltage switching current penalty) is needed for each switching voltage. One clock cycle is needed for each switch. A threshold value Sth is set to be 0.5. A rank interleave parameter β and a number request parameter $N_Q$ are set to be 10 clock cycles for each sampling period. A voltage switching determination period is set to be 50 clock cycles. The memory is initially set in a low voltage operation mode. The simulation cycle for CPU (Central Processing Unit) is set to be 10 M Hz. In FIG. 7, $BW_s$(GB/s) represents a bandwidth for switching voltage according to the memory controlling method of this disclosure. $BW_n$(GB/s) represents a bandwidth without switching voltage. ΔBW (%) represents a variation of a bandwidth in percentage. $ΔE_{ff}$ (%) represents a variation of energy efficiency in percentage. The energy efficiency is defined as a reciprocal of power consumption for reading/writing per bit. In other words, the less the power is consumed for reading/writing per bit, the higher the energy efficiency will be. γ is defined as bandwidth*energy efficiency. $γ_s$ represents a γ value with switching voltage by using the memory controlling method of the disclosure. $γ_n$ represents a γ value without switching voltage. Δγ represents a variation of bandwidth*energy in percentage. In other words, γ can be determined by considering both the decreased bandwidth and the saved power consumption, according to the exemplary embodiments of the disclosure. The larger the γ is, the higher the energy efficiency will be. The lower the bandwidth is reduced, the better the system performance will be.

According to the aforementioned embodiments, a memory system and a memory controlling method are provided. The states of multiple memory control commands are analyzed to generate a control parameter. Whether at least one switching command is sent is determined according to the control parameter, the current operation mode of the memory device, and the operation state of the particular memory rank. The memory device is switchable between a low voltage operation mode and a normal voltage operation mode according to the at least one switching command. The power consumption of the memory system can be economized without changing the operation frequency of the memory device. The broad bandwidth is also kept. Comparing with well-known memories with decreased power consumptions, the clock frequency of the bus can be kept according to the exemplary embodiments of the disclosure. In addition, since the operation frequencies of the memory device and the memory controller are not changed according to the exemplary embodiments of the disclosure, a complex circuit design is not needed for the memory system.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory system, comprising:
    a memory device having one or more memory ranks and a plurality of memory internal circuits electrically connected to the one or more memory ranks; and
    a memory controller at least including at least one analysis module and at least one switching determination module, wherein the analysis module analyzes one or more states of a plurality of memory control commands corresponding to a particular memory rank of the one or more memory ranks and generates a control parameter, and the switching determination module determines whether at least one switching command is sent according to the control parameter, a current operation mode of the particular memory rank and an operation state of the particular memory rank; and
    wherein when the memory device receives a first switching command of the at least one switching command, the particular rank and at least one part of the plurality of memory internal circuits are switched from a normal voltage operation mode to a low voltage operation mode,
    wherein the switching determination module determines the at least one switching command is not sent when the operation state of the particular memory rank is a burst mode, a reading mode or a writing mode.

2. The memory system according to claim 1, wherein the memory controller further includes a plurality of command queues corresponding to the particular memory rank, the one or more states of the plurality of memory control commands stored in the plurality of command queues are analyzed to generate a rank interleave parameter, and the control parameter is generated according to the rank interleave parameter.

3. The memory system according to claim 1, wherein the memory controller further includes a plurality of command queues corresponding to the particular memory rank, a total quantity of the plurality of memory control commands stored in the plurality of command queues is analyzed to generate a number request parameter, and the control parameter is generated according to the number request parameter.

4. The memory system according to claim 1, wherein the memory controller further includes a plurality of command queues corresponding to the particular memory rank, the one or more states and a total quantity of the plurality of memory control commands stored in the plurality of command queues are analyzed to generate a rank interleave parameter and a number request parameter, and the control parameter is generated according to the rank interleave parameter and the number request parameter.

5. The memory system according to claim 4, wherein the analysis module determines the control parameter representing the normal voltage operation mode is generated when a product of the rank interleave parameter and the number request parameter is greater than a threshold value.

6. The memory system according to claim 5, wherein the switching determination module determines a second switching command of the at least one switching command is sent to switch the particular memory rank and the at least one part of the memory internal circuits from the low voltage operation mode to the normal voltage operation mode, when the current operation mode of the particular memory rank is the low voltage operation mode.

7. The memory system according to claim 1, wherein the plurality of memory internal circuits further includes a plurality of timing dependence circuits and a plurality of timing independence circuits, and the plurality of timing independence circuits are switched from the normal voltage operation mode to the low voltage operation mode when the memory device receives the first switching command.

8. The memory system according to claim 7, wherein the plurality of timing dependence circuits further include a plurality of receivers, a bit line sensing amplifier, an off chip driver, a data input/output pulse circuit, and a data input/output circuit, and a cell array having the one or more memory ranks.

9. The memory system according to claim 7, wherein the plurality of timing independence circuits further include a row request circuit, a row pre-decoder, a global word line decoder, a local word line decoder, a column request circuit, a column decoder, a bit switch driver, a local word line driver, a data amplifier, a data input buffer, and a data output buffer.

10. A method for controlling a memory in a memory system, the memory system having a plurality of memory internal circuits and one or more memory ranks electrically connected to the plurality of memory internal circuits, and the method comprising:
    analyzing one or more states of multiple memory control commands corresponding to a particular memory rank of the one or more memory ranks, and generating a control parameter, determining whether at least one switching command is sent according to the control parameter, a current operation mode of the particular memory rank, and an operation state of the particular memory rank; and
    switching the particular rank and at least one part of the plurality of memory internal circuits from a normal voltage operation mode to a low voltage operation mode, when a memory device in the memory system receiving a first switching command of the at least one switching command,
    wherein said determining whether the at least one switching command is sent according to the control parameter, the current operation mode of the particular memory rank, and the operation state of the particular memory rank further includes:
    determining the at least one switching command is not sent when the operation state of the particular memory rank is a burst mode, a reading mode or a writing mode.

11. The method according to claim 10, wherein a memory controller in the memory system has a plurality of command queues corresponding to the particular memory rank, and said analyzing the one or more states of the multiple memory control commands corresponding to the particular memory rank and said generating the control parameter further include:
    analyzing the one or more states of the multiple memory control commands stored in the plurality of command queues, and generating a rank interleave parameter; and
    generating the control parameter according to the rank interleave parameter.

12. The method according to claim 10, wherein a memory controller in the memory system has a plurality of command queues corresponding to the particular memory rank, and said analyzing the one or more states of the multiple memory control commands corresponding to the particular memory rank and said generating the control parameter further include:
    analyzing a total quantity of the multiple memory control commands stored in the plurality of command queues, and generating a number request parameter; and
    generating the control parameter according to the number request parameter.

13. The method according to claim 10, wherein a memory controller in the memory system has a plurality of command queues corresponding to the particular memory rank and said analyzing the one or more states of the multiple memory control commands corresponding to the particular memory rank and said generating the control parameter further include:
    analyzing a total quantity of the multiple memory control commands stored in the plurality of command queues, and generating a number request parameter;
    analyzing a total quantity of the multiple memory control commands stored in the command queues, and generating a number request parameter; and
    generating the control parameter according to the rank interleave parameter and the number request parameter.

14. The method according to claim 13, wherein said analyzing the one or more states of the multiple memory control commands corresponding to the particular memory rank, and said generating the control parameter further include:
    determining the control parameter representing the normal voltage operation mode is generated when a product of the rank interleave parameter and the number request parameter is greater than a threshold value.

15. The method according to claim 14, wherein said determining whether the at least one switching command is sent according to the control parameter, the current operation mode of the particular memory rank, and the operation state of the particular memory rank further includes:
    determining a second switching command of the at least one switching command is sent to switch the particular memory rank and the at least one part of the memory internal circuits from the low voltage operation mode to the normal voltage operation mode, when the current operation mode of the particular memory rank is the low voltage operation mode.

16. The method according to claim 10, wherein the plurality of timing dependence circuits further include a plurality of receivers, a bit line sensing amplifier, an off chip driver, a data input/output pulse circuit, a data input/output circuit, and a cell array having the one or more memory ranks.

17. The method according to claim 10, wherein the plurality of timing independence circuits further include a row request circuit, a row pre-decoder, a global word line decoder, a local word line decoder, a column request circuit, a column decoder, a bit switch driver, a local word line driver, a data amplifier, a data input buffer and a data output buffer.

18. The method according to claim 10, wherein the plurality of memory internal circuits have a plurality of timing dependence circuits and a plurality of timing independence circuits, and said switching the particular rank and the at least one part of the plurality of memory internal circuits from the normal voltage operation mode to the low voltage operation mode further includes:
    switching the plurality of timing independence circuits from the normal voltage operation mode to the low voltage operation mode, when the memory device having the one or more memory ranks receives the first switching command.

* * * * *